US012635407B2

(12) United States Patent
Chen

(10) Patent No.: US 12,635,407 B2
(45) Date of Patent: May 19, 2026

(54) PREPARATION METHOD OF CHARGE TRANSPORT LAYER AND LIGHT-EMITTING DIODE

(71) Applicant: TCL TECHNOLOGY GROUP CORPORATION, Guangdong (CN)

(72) Inventor: Kaimin Chen, Guangdong (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 641 days.

(21) Appl. No.: 17/935,781

(22) Filed: Sep. 27, 2022

(65) Prior Publication Data

US 2023/0105743 A1 Apr. 6, 2023

Related U.S. Application Data

(63) Continuation of application No. PCT/CN2021/129007, filed on Nov. 5, 2021.

(30) Foreign Application Priority Data

Dec. 24, 2020 (CN) .......................... 202011552242.3

(51) Int. Cl.
*H10K 50/115* (2023.01)
*H10K 50/15* (2023.01)
(Continued)

(52) U.S. Cl.
CPC ......... *H10K 85/631* (2023.02); *H10K 50/115* (2023.02); *H10K 50/15* (2023.02);
(Continued)

(58) Field of Classification Search
CPC ........ H10K 71/15; H10K 71/40; H10K 71/12; H10K 71/811; H10K 85/631;
(Continued)

(56) References Cited

U.S. PATENT DOCUMENTS

2013/0270545 A1* 10/2013 Tanaka ................. H10K 85/115
528/8
2015/0097162 A1* 4/2015 Ono ................... H10K 85/6572
556/407
(Continued)

FOREIGN PATENT DOCUMENTS

CN 105378027 A 3/2016
CN 107602553 A 1/2018
(Continued)

OTHER PUBLICATIONS

Hefeng Cui et al., Research Progress on Functional Layer Materials of Quantum Dot LEDs Fabricated by the Spin-Coating Method, Micronanoelectronic Technology, Apr. 2018, pp. 225-233, vol. 55 No. 4.

*Primary Examiner* — Omar F Mojaddedi

(57) ABSTRACT

The present application provides a preparation method of a charge transport layer, which includes steps of: forming a first film layer by a first solution containing a functional material, forming a second film layer by a second solution containing a charge transport material, the first film layer and the second film layer are in contact with each other, or forming a mixed film layer by a mixed solution of the first solution and the second solution; and removing the functional material to obtain a charge transport layer. The functional material is an organic substance containing an electron-donating group, a surface of the charge transport material has a metal cation dangling bond, and the electron-donating group is capable of being bonded with the metal cation dangling bond.

16 Claims, 2 Drawing Sheets

(51) Int. Cl.

| | |
|---|---|
| *H10K 50/16* | (2023.01) |
| *H10K 71/15* | (2023.01) |
| *H10K 71/40* | (2023.01) |
| *H10K 85/60* | (2023.01) |
| *H10K 102/00* | (2023.01) |

(52) U.S. Cl.
CPC ............. *H10K 50/16* (2023.02); *H10K 71/15* (2023.02); *H10K 71/40* (2023.02); *H10K 2102/00* (2023.02)

(58) Field of Classification Search
CPC .. H10K 2102/00; H10K 50/115; H10K 50/15; H10K 50/16; Y02E 10/549
See application file for complete search history.

(56)            References Cited

U.S. PATENT DOCUMENTS

| | | | |
|---|---|---|---|
| 2017/0115564 A1 | 4/2017 | Yonezawa et al. | |
| 2017/0149004 A1* | 5/2017 | Lee ........................ | H10K 85/50 |
| 2022/0204800 A1* | 6/2022 | Pousthomis ....... | H10H 20/8513 |
| 2023/0380206 A1* | 11/2023 | Yamamoto ............. | H10K 50/16 |

FOREIGN PATENT DOCUMENTS

| | | |
|---|---|---|
| CN | 107626287 A | 1/2018 |
| CN | 111224000 A | 6/2020 |
| KR | 20180060277 A | 6/2018 |
| WO | 2004035476 A1 | 4/2004 |
| WO | 2018076901 A1 | 5/2018 |

* cited by examiner

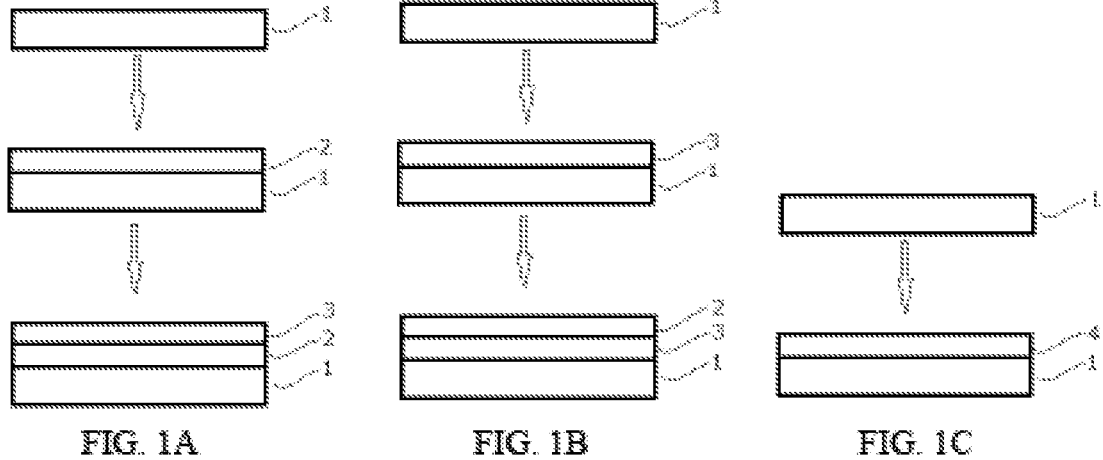
FIG. 1A                    FIG. 1B                    FIG. 1C
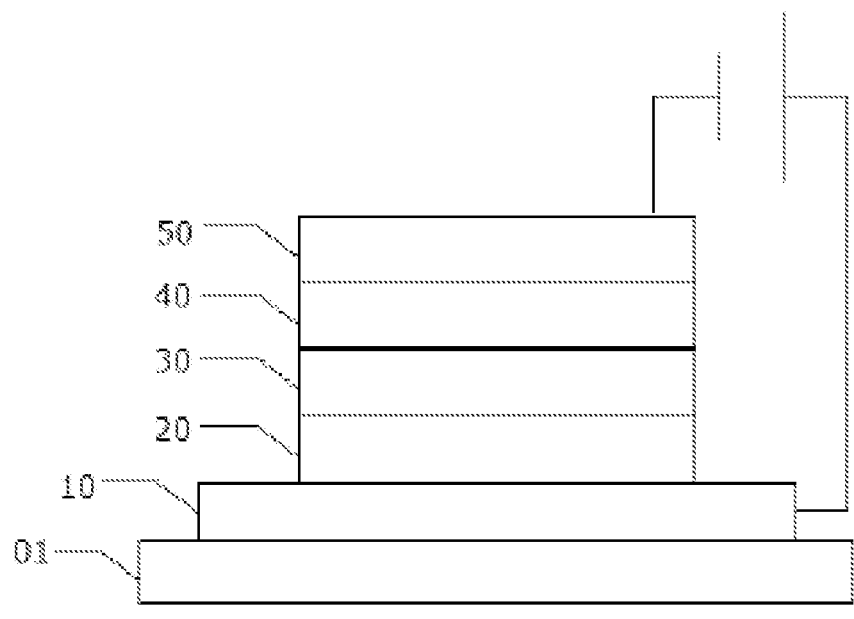
FIG. 2

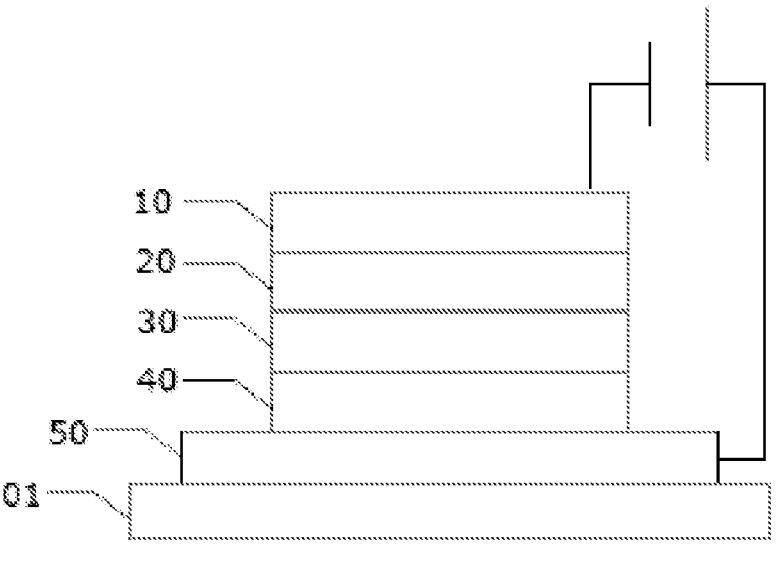
FIG. 3
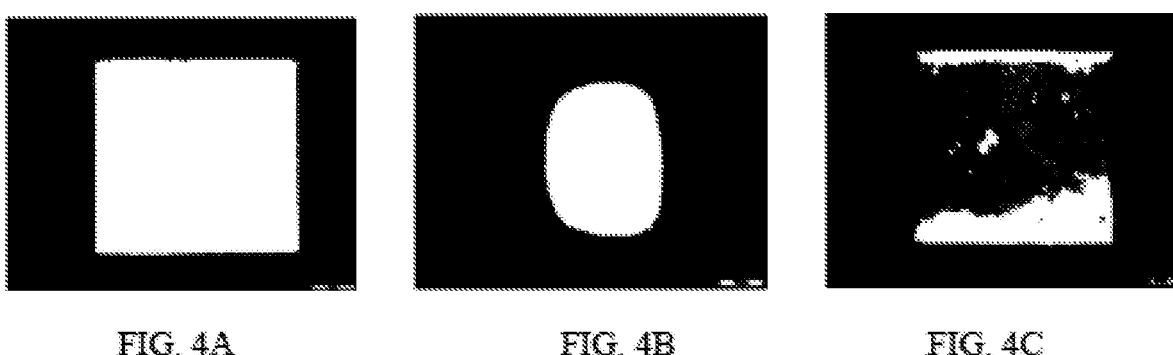
FIG. 4A                 FIG. 4B                 FIG. 4C

PREPARATION METHOD OF CHARGE TRANSPORT LAYER AND LIGHT-EMITTING DIODE

CROSS-REFERENCE TO RELATED APPLICATION

This application is a continuation of International Application No. PCT/CN2021/129007, filed on Nov. 5, 2021, which claims the benefit of Chinese Patent Application No. 202011552242.3, filed on Dec. 24, 2020, the entire contents of which are incorporated herein by reference.

BACKGROUND

1. Technical Field

The present application relates to the field of optoelectronic technology, and particularly, to a preparation method of a charge transport layer and a light-emitting diode.

2. Related Art

Charge transport layers (CTLs), namely, electron transport layers (ETLs) and hole transport layers (HTLs), are essential components for advanced solution-processed optoelectronic devices. The charge transport layer (CTL) affects not only charge injection within an active layer, but also many other fundamental physical processes of device operation, such as interfacial charge recombination and light extraction (or light absorption) in LEDs (or solar cells).

In recent years, colloidal metal oxide nanocrystals have attracted great interest as a charge transport layer (CTL), such as an electron transport layer (ETL) based on colloidal ZnO nanocrystals, which has been applied in several prototype devices, exhibiting good performance. Furthermore, colloidal oxide nanocrystals are fully compatible with large-scale industrial production, thus showing a bright prospect for high-performance, low-cost, and large-area devices.

The current research on the application of colloidal metal oxide nanocrystals in optoelectronic devices mainly focuses on the synthesis chemistry of colloidal oxide nanocrystals, ligand chemistry that may be applicable to the colloidal oxide nanocrystals, and chemistry related to post-deposition treatment. Regarding the post-deposition treatment, an orthogonal solvent system is used in current ink schemes to deposit adjacent functional layers. In addition, a continuous, pinhole-free CTL film having a controllable overall thickness can be basically realized by adjusting the viscosity and surface tension of ink.

In practical applications, the existing deposited CTL films still have certain shortcomings. For example, defects caused by the local agglomeration of colloidal metal oxide nanocrystals in the film not only reduce the exciton mobility of CTL, but also the formed excitons may also dissociate at the defects resulting in reduced device efficiency. The main cause of the local defects is the uncontrolled deposition process, and the research on the local defects of the CTL films is rarely reported.

SUMMARY

One objective of the present application is to solve the problems of low exciton mobility and exciton dissociation due to local defects in the charge transport layer formed of colloidal metal oxide nanocrystals in the existing technologies by providing a preparation method of a charge transport layer and a light-emitting diode.

In accordance with an aspect of the present application, a preparation method of a charge transport layer is provided. The preparation method of the charge transport layer includes the following steps: forming a first film layer by a first solution containing a functional material, forming a second film layer by a second solution containing a charge transport material, and enabling the first film layer and the second film layer to be in contact with each other, or alternatively, forming a mixed film layer by a mixed solution of the first solution containing the functional material and the second solution containing the charge transport material; and removing the functional material to obtain a charge transport layer. The functional material is an organic substance containing an electron-donating group, a surface of the charge transport material has a metal cation dangling bond, and the electron-donating group is capable of being bonded with the metal cation dangling bond.

In an implementation, the enabling the first film layer and the second film layer to be in contact with each other includes steps of: forming the second film layer on a matrix by the second solution; and forming the first film layer on a surface of the second film layer by the first solution.

In an implementation, the enabling the first film layer and the second film layer to be in contact with each other includes steps of: forming the first film layer on a matrix by the first solution; and forming the second film layer on a surface of the first film layer by the second solution.

In an implementation, the step of forming the mixed film layer by the mixed solution of the first solution and the second solution includes a step of forming the mixed film layer on a matrix by the mixed solution of the first solution and the second solution.

In an implementation, in the first and second film layers that are in contact with each other or in the mixed film layer, a molar ratio of the functional material to the charge transport material is in a range from 1.5:1 to 3:1.

In an implementation, the functional material includes triethylamine.

In an implementation, a volume ratio of the functional material to a solvent in the first solution is in a range from 1:1 to 1:50.

In an implementation, a solvent of the first solution includes at least one of acetone, n-butanol, tetrahydrofuran, and methyl formate.

In an implementation, solvents of the first solution and the second solution are mutually soluble or have similar polarities when the first film layer and the second film layer are in contact with each other.

In an implementation, the step for removing the functional material includes a step of performing a heat treatment on the first film layer and the second film layer being in contact with each other or performing the heat treatment on the mixed film layer in an inert gas atmosphere, so that the functional material is volatilized or removed from the first film layer and the second film layer being in contact with each other or from the mixed film layer.

In an implementation, the heat treatment is performed at a temperature in a range from 90° C. to 150° C.

In an implementation, on the basis that the heat treatment is performed at a temperature in a range from 90° C. to 150° C., time for the heat treatment is in a range from 5 min to 24 h.

In an implementation, the charge transport material is a hole-transport material or an electron-transport material.

In an implementation, the hole-transport material includes at least one of $MoO_3$, $NiO$, $V_2O_5$, and $WO_3$, or includes at least one of $MoO_3$, $NiO$, $V_2O_5$ and $WO_3$ doped with at least one of Li, Al, Mg, Cs, In, Ga, and Zr.

In an implementation, the electron-transport material includes at least one of ZnO, SnO, $TiO_2$ and $ZrO_2$, or includes at least one of ZnO, SnO, $TiO_2$ and $ZrO_2$ doped with at least one of Li, Al, Mg, Cs, In, Ga, and Zr.

In accordance with yet another aspect of the present application, a light-emitting diode is provided. The light-emitting diode includes an electron transport layer, and the electron transport layer is prepared according to the preparation method of the charge transport layer of the present application. The charge transport material is an electron-transport material.

Or alternatively, the light-emitting diode includes a hole transport layer, and the hole transport layer is prepared according to the preparation method of the charge transport layer of the present application. The charge transport material is a hole-transport material.

Or alternatively, the light-emitting diode includes an electron transport layer and a hole transport layer. The electron transport layer is prepared according to the preparation method of the charge transport layer of the present application, and the charge transport material is an electron-transport material. The hole transport layer is prepared according to the preparation method of the charge transport layer of the present application, and the charge transport material is a hole-transport material.

In an implementation, the light-emitting diode is a quantum-dot light-emitting diode (QLED) or an organic light-emitting diode (OLED).

Compared with the existing technologies, the present application has the following beneficial effects:

In the preparation method of the charge transport layer provided by the present application, the second solution and the first solution are respectively used to form a film layer, or the first and second solutions is mixed first and then used to form a film layer, in this way, the functional material will be bonded with the metal cation dangling bonds on the surface of the metal oxide nanomaterial, to achieve an effect of end capping. During a volatilization process of solvents in the charge transport wet film layer, the metal oxide nanomaterials with functional materials on the surface will first form a stable state similar to "oligomers", and then these "oligomers" will undergo an ordered arrangement similar to polymer polymerization during a deposition process, so that the metal oxide nanomaterials become ordered in the deposition process and reduce the chance of defects in the film formation process. In this way, the metal oxide nanomaterials in the prepared charge transport layer can be arranged in an orderly manner, and the charge transport layer has few or no defects, so that the charge transport layer has a high exciton mobility and can avoid the phenomenon of exciton dissociation. In addition, conditions for forming a layer structure in the preparation method of the charge transport layer are controllable, which effectively ensures the stable performance of the prepared charge transport layer and the high efficiency for preparing the charge transport layer.

Since the light-emitting diode provided by the present application includes the charge transport layer prepared according to the above preparation method of the charge transport layer of the present application, the electron transport layer and/or the hole transport layer are prepared according to the above preparation method of the charge transport layer of the present application. In this way, the metal oxide nanomaterials contained in the electron transport layer and/or hole transport layer included in the light-emitting diode can be arranged in an orderly manner, and the charge transport layer has few or no defects, thereby endowing the charge transport layer with the characteristics of high exciton mobility, and thereby the light-emitting diode of the present application is endowed with high luminous efficiency.

BRIEF DESCRIPTION OF DRAWINGS

In order to illustrate solutions in embodiments of the present application more clearly, the following will briefly introduce the drawings that need to be used for description of the embodiments or exemplary technologies. Obviously, the drawings in the following description are merely some embodiments of the present application, and for those of ordinarily skills in the art, other drawings may also be obtained on the basis of these drawings without any creative work.

FIGS. 1A-1C respectively show a schematic diagram of a process flow of a preparation method of a charge transport layer in accordance with an embodiment of the present application; FIG. 1A shows a first preparation method of the charge transport layer in accordance with an embodiment of the present application; FIG. 1B shows a second preparation method of the charge transport layer in accordance with an embodiment of the present application; and FIG. 1C shows a third preparation method of the charge transport layer in accordance with an embodiment of the present application;

FIG. 2 is a schematic structural diagram of a light-emitting diode in a positive configuration according to an embodiment of the present application;

FIG. 3 is a schematic structural diagram of a light-emitting diode in an inversion configuration according to an embodiment of the present application; and FIGS. 4A-4C respectively show an electroluminescence (EL) topography diagram of positive light-emitting diodes provided in Examples 1 to 2 and Comparative Example 3 of the present application; FIG. 4A shows the EL topography diagram of the positive light-emitting diode provided in Example 1; FIG. 4B shows the EL topography of the positive light-emitting diode provided in Example 2; and FIG. 4C shows the EL topography diagram of the positive light-emitting diode provided in Comparative Example 3.

DETAILED DESCRIPTION

In order to make the objectives, solutions, and advantages of the present application more comprehensible, the following further describes the present application in detail with reference to the embodiments. It should be understood that the specific embodiments described here are merely used to illustrate the present application, and are not intended to limit the present application. All other embodiments obtained by those of ordinary skill in the art on the basis of the embodiments in the present application without creative efforts shall fall within the protection scope of the present application.

In accordance with an aspect of embodiments of the present application, a preparation method of a charge transport layer is provided. The preparation method of the charge transport layer includes steps of forming a first film layer by a first solution containing a functional material and forming a second film layer by a second solution containing a charge transport material, and enabling the first film layer and the second film layer to be in contact with each other, and then removing the functional material to obtain a charge transport layer; or includes steps of forming a mixed film layer by a mixed solution of the first solution and the second solution, and then removing the functional material to obtain a charge transport layer. Thus, in the embodiments, at least the following three preparation method of the charge transport layer are included.

In a first preparation method of the charge transport layer, a process flow of the first preparation method is shown in FIG. 1A, which includes steps of S01, S02 and S03.

In step S01, the second film layer 2 is formed on a matrix 1 by the second solution containing the charge transport material.

In step S02, the first film layer 3 is formed on a surface of the second film layer 2 by the first solution containing the functional material.

In step S03, the functional material contained in a composite wet film layer formed by the second film layer 2 and the first film layer 3 is removed to form the charge transport layer.

The process flow of a second preparation method is shown in FIG. 1B, which includes steps of S04, S05 and S06.

In step S04, the first film layer 3 is formed on the matrix 1 by the first solution containing the functional material.

In step S05, the second film layer 2 is formed on the first film layer 3 by the second solution containing the charge transport material.

In step S06, the functional material contained in the composite wet film layer formed by the second film layer 2 and the first film layer 3 is removed to form the charge transport layer.

The process flow of a third preparation method is shown in FIG. 1C, which includes steps of S07 and S08.

In step S07, a mixed film layer 4 is formed on the matrix 1 by a mixed solution of the first solution containing the functional material and the second solution containing the charge transport material.

In step S08, the functional material contained in the mixed film layer 4 is removed to form the charge transport layer.

In the above methods for preparing the charge transport layer, the functional material contained in the first solution in steps S02, S04 and S07 is an organic substance containing an electron-donating group, and in steps S01, S05 and S07, the surface of the charge transport material contained in the second solution has metal cation dangling bonds, and the electron-donating group contained in the functional material can be bonded with the metal cation dangling bonds on the surface of the charge transport material. In this way, when the first film layer 3 or the second film layer 2 are respectively formed by the first solution containing the functional material and the second solution containing the charge transport material, as shown in steps S01 to S02 or in steps S04 to S05, two solvents of the first and second solutions will fuse as the two first and second film layers are wet film layers. At this time, the functional material will be in direct contact with the charge transport material in the composite wet film layer, so that the electron-donating group contained in the functional material can be bonded with the metal cation dangling bonds on the surface of the charge transport material. In step S07, the functional material and the charge transport material contained in the mixed solution are in direct contact in the mixed film layer 4. In this way, the electron-donating group contained in the functional material is bonded with the metal cation dangling bond on the surface of the charge transport material to achieve the effect of end capping. During the process of removing the functional material contained in the composite wet film layer or the mixed film layer in step S03, step S06 and step S08, and during a volatilization process of the solvent in the composite wet film layer or the mixed film layer 4, the charge transport material having a surface bound with the functional material will first form a stable state similar to "oligomers", and then these "oligomers" will undergo an ordered arrangement similar to polymer polymerization during a deposition process, so that the charge transport material becomes ordered in the deposition process, reducing the chance of defects in the film formation process. Thus, in the embodiments of the present application, the charge transport materials in the prepared charge transport layer can be arranged in an orderly manner by providing functional materials in the corresponding process steps, and thus the charge transport layer has few or no defects, thereby enabling the charge transport layer to have high exciton mobility, and avoiding the phenomenon of exciton dissociation.

Based on the applicant's study of functional materials, it is found that the functional materials suitable for the embodiments of the present application can satisfy the following three characteristics: 1) solution processable; 2) have electron-donating groups, which can form similar "Oligomer" with charge transport materials to achieve the desired effect; 3) easy to be removed. Among them, the characteristics in items 1) and 2) are the basic requirements, and the characteristic in item 3) is optional. Thus, in one embodiment, the above functional material includes triethylamine.

Based on the functions of the functional materials and the exemplary types as above-mentioned, in one embodiment, a volume ratio of the functional material and the solvent contained in the first solution in step S02, step S04 and step S07 is in a range from 1:1 to 1:50. In another embodiment, the solvent contained in the first solution includes at least one of acetone, n-butanol, tetrahydrofuran, and methyl formate. By controlling and optimizing the concentration of the functional material in the first solution and optimizing the selection of the solvent, the film formation uniformity of the first film layer 3 or the mixed film layer 4 is improved, so that the functional material can fully interact with the charge transport material, thereby improving the orderly arrangement of the charge transport material in the formed charge transport layer, and thus the charge transport layer has few or no defects.

In another embodiment, the thickness of the first film layer 3 is controlled in step S02 and step S04 or the mixing ratio of the functional material and the charge transport material contained in the mixed solution is controlled in step S07, to ensure that the functional material relative to the charge transport material is in sufficient amount, enabling the functional material to be bonded with the metal cation dangling bonds on the surface of the charge transport material to achieve the effect of end capping, and enabling the charge transport material to be fully ordered in the formed charge transport layer, thereby further reducing or completely eliminating defects in the charge transport layer to further improve the efficiency for transferring exciton in the charge transport layer. Thus, in one embodiment, the molar ratio of the functional material in the first film layer 3 to the charge transport material in the second film layer 2 is in a range from 1.5:1 to 3:1. Alternatively, in the mixed solution in step S07, that is, in the mixed film layer 4, the molar ratio of the functional material to the charge transport material is in a range from 1.5:1 to 3:1.

In addition, the first film layer 3 in steps S02 and S04 may be formed according to the existing methods of solution film formation. Specifically, the first film layer 3 may be formed with reference to the film formation of the charge transport layer, in a specific embodiment, the method for forming the first film layer 3 includes spin coating, ink jet printing, spray coating, blade coating or other methods.

The second solution in step S01, step S05 and step S07 may be a conventional second solution used for preparing a charge transport layer. It would be obvious that the second solution contains a charge transport material. In an embodiment of the present application, the charge transport material includes metal oxide nanomaterials (i.e., metal oxide nanocrystalline materials), that is, the second solution in step S01, step S05 and step S07 contains metal oxide nanomaterials.

Since the charges include electrons and holes, the second solution in step S01, step S05 and step S07 may be an electron-transport material ink or a hole-transport material ink. In case that the second solution in step S01, step S05 and step S07 is the electron-transport material ink, then the electron-transport material contained in the electron-transport material ink includes a metal oxide nanomaterial, and the metal oxide nanomaterial is a nano-metal oxide electron-transport material. In one embodiment, the nano-metal oxide electron-transport material includes at least one of ZnO, SnO, $TiO_2$ and $ZrO_2$, or includes at least one of metal-doped ZnO, SnO, $TiO_2$ and $ZrO_2$. The doping metal for doping at least one of ZnO, SnO, $TiO_2$ and $ZrO_2$ includes at least one of Li, Al, Mg, Cs, In, Ga, Zr. The selection of the nano-metal oxide electron-transport material enables not only the formed electron transport layer to present good continuity, no pinholes and overall thickness and have high electron-transport efficiency, but more importantly, it also enables the formed electron transport layer to interact with the functional materials contained in the first solution in step S02, step S04 and step S07 as above-described, and thus the formed electron transport layer has few or no defects, and has high efficiency for electron-transport.

In case that the second solution in step S01, step S05 and step S07 is the hole-transport material ink, then the hole-transport material contained in the hole-transport material ink includes a metal oxide nanomaterial, and the metal oxide nanomaterial is a nano-metal oxide hole-transport material. In one embodiment, the nano-metal oxide hole-transport material includes at least one of $MoO_3$, NiO, $V_2O_5$ and $WO_3$, or at least one of metal-doped $MoO_3$, NiO, $V_2O_5$ and $WO_3$. The doping metal used for doping at least one of $MoO_3$, NiO, $V_2O_5$ and $WO_3$ includes at least one of Li, Al, Mg, Cs, In, Ga, and Zr.

In addition, the concentration of the second solution in step S01, step S05 or step S07 is adjustable according to requirements for forming the charge transport wet film layer such as the second film layer 2 and the mixed film layer 4. To ensure that the second film layer 2 and the first film layer 3 can be fully fused to improve the quality of the composite wet film layer. In an exemplary embodiment, the charge transport layer is prepared according to the first or second preparation method as above, then the step S02 should be performed immediately to form the first film layer 3 after the second film layer 2 is formed in the step S01, or the step S05 should be performed immediately to form the second film layer 2 after the first film layer 3 is formed in the step S04, so that the second film layer 2 and the first film layer 3 have sufficient fusion time.

In addition, the second film layer 2 in step S01 or step S05 and the mixed film layer 4 in step S07 may be formed according to the existing methods for solution film formation. In a specific embodiment, the method for forming the second film layer 2 and the mixed film layer 4 includes spin coating, ink jet printing, spray coating, blade coating or other methods. When the second film layer 2 is formed by a process of spin coating, the solvents of the second film layer 2 and the first film layer 3 are mutually soluble and have similar polarities. When the process of spin coating is utilized to form the second film layer 2, a small amount of the second film layer 3 may be peeled off due to the characteristics of the process of pin coating, this may be compensated by statistics and calculations of the amount of loss in advance and adjusting the thickness of the second film layer 2, etc.

The matrix 1 in step S01, step S04 and step S07 may be any matrix that needs to form a charge transport layer on a surface of a component or a device corresponding to the matrix. In accordance with a conventional application of the charge transport layer, the matrix may be a component contained in an electroluminescent device (such as a light-emitting diode), such as a surface of a positive electrode, a negative electrode, an electron injection layer, a hole injection layer, or a light emitting layer, which may be different according to the preparation sequence of the corresponding electroluminescent devices.

The step of removing the functional material to obtain the charge transport layer in the above embodiments, such as in step S03, step S06 and step S08, the functional material is removed to obtain the charge transport layer, also includes a step of performing a drying treatment on the first film layer 3 and the second film layer 2 or the mixed film layer 4 to effectively remove the functional material in the composite wet film layer or the mixed film layer 4 and simultaneously remove the solvent to form a charge transport layer. In one embodiment, the drying treatment includes a step of performing a heat treatment on the composite wet film layer or the mixed film layer 4 in an inert gas atmosphere.

In a specific embodiment the temperature for the heat treatment is in a range from 90° C. to 150° C. Through this drying treatment, the solvent and functional material of the composite wet film layer or the mixed film layer 4 are volatilized and cured to form a charge transport layer. In addition, time for the drying treatment, such as the heat treatment at 90° C. to 150° C., should be sufficient, and the specific time for the heat treatment may ranges from 5 mins to 24 hrs, which is adjustable according to the thickness and solvent properties of the composite wet film layer or the mixed film layer 4 based on actual situations.

Thus, the preparation method of the charge transport layer in accordance with an embodiment of the present application can not only ensure that the functional material contained in the first solution interacts with the charge transport material in the second solution, enabling the charge transport material in the prepared charge transport layer to be arranged in an orderly manner, so that the charge transport layer has few or no defects, and thus the charge transport layer has the characteristics of high exciton mobility and the phenomenon of exciton dissociation can be avoided. In addition, conditions for forming a layer structure in the preparation method of the charge transport layer are controllable, which effectively ensures the stable performance of the prepared charge transport layer and the high efficiency for preparing the charge transport layer.

On the other hand, based on the preparation method of the charge transport layer as above-described, an embodiment of the present application further provides a light-emitting diode. The light-emitting diode includes an electron transport layer and a hole transport layer. It should be understood that the light-emitting diode also includes other necessary layer structures necessary to the light-emitting diode, such as a light emitting layer, an anode and a cathode. The electron transport layer included in the light-emitting diode is an electron transport layer prepared according to the above preparation method of the charge transport layer. The charge transport material contained in the second solution is the electron-transport material when the electron transport layer is prepared according to the above preparation method of the charge transport layer.

Alternatively, the hole transport layer included in the light-emitting diode is a hole transport layer prepared according to the above preparation method of the charge transport layer. The charge transport material contained in the second solution is the hole-transport material when the hole transport layer is prepared according to the above preparation method of the charge transport layer.

In addition, the electron transport layer and the hole transport layer included in the light-emitting diode may be simultaneously prepared according to the above preparation method of the charge transport layer, respectively. Or alternatively, either the electron transport layer or the hole transport layer is prepared according to the above preparation method of the charge transport layer. In an embodiment of the present application, the electron transport layer and the hole transport layer are prepared according to the above preparation method of the charge transport layer, which can improve both the electron-transport efficiency and hole-transport efficiency, thereby improving the excitation efficiency in the light-emitting layer. Thus, the luminous efficiency of light-emitting diodes can be improved, such as improving the external quantum efficiency (EQE) of light-emitting diodes.

According to the light-emitting material contained in the light-emitting layer, the light-emitting diode in the embodiments of the present application may be a quantum-dot light-emitting diode (QLED) or an organic electroluminescent diode (OLED). According to the structural arrangement of the light-emitting diode, the light-emitting diode in the embodiments of the present application may be a positive light-emitting diode or an inversion light-emitting diode.

In one embodiment, the structure of the positive light-emitting diode is shown in FIG. 2, an anode 10 and a cathode 50 are disposed opposite to each other, forming a stacked structure. The anode 10 is stacked on a substrate 01, and a light-emitting functional layer is laminated and bonded between the anode 10 and the cathode 50. The light-emitting functional layer includes a light-emitting layer 30, a hole transport layer 20 and an electron transport layer 40. From the anode 10 to the cathode 50, the hole transport layer 20, the light-emitting functional layer 30, and the electron transport layer 40 are stacked in sequence. Furthermore, a hole injection layer (not shown in FIG. 2) may also be arranged between the hole transport layer 20 and the anode 10, and/or an electron injection layer (not shown in FIG. 2) may also be arranged between the electron transport layer 40 and the cathode 50.

In case that the hole transport layer 20 is prepared according to the above preparation method of the charge transport layer, the formed anode 10 serves as a matrix 1, the hole-transport material ink serves as the second solution, and the hole transport layer 20 is prepared on the outer surface of the anode 10 according to the above preparation method of the charge transport layer. In case that a hole injection layer is included in the positive light-emitting diode, as shown in FIG. 2, then the formed hole injection layer serves as the matrix 1, the hole-transport material ink serves as the second solution, and the hole transport layer 20 is prepared on the outer surface of the hole injection layer according to the above preparation method of the charge transport layer. Subsequently, the light emitting layer 30, the electron transport layer 40, (or the hole injection layer further formed) and the cathode 50 are successively formed on the outer surface of the hole transport layer 20 according to the existing methods.

In case that the electron transport layer 40 is prepared according to the above preparation method of the charge transport layer, the formed light-emitting layer 30 serves as the matrix 1, the electron-transport material ink serves as the second solution, and the electron transport layer 40 is prepared on the outer surface of the light-emitting layer 30 according to the above preparation method of the charge transport layer.

In another embodiment, the structure of the inversion light-emitting diode is shown in FIG. 3, an anode 10 and a cathode 50 are disposed opposite to each other, forming a stacked structure. The cathode 50 is stacked on the substrate 01, and a light-emitting functional layer is laminated and bonded between the cathode 10 and the cathode 50. The light-emitting functional layer includes a light-emitting layer 30, a hole transport layer 20 and an electron transport layer 40. From the anode 10 to the cathode 50, the hole transport layer 20, the light-emitting functional layer 30, and the electron transport layer 40 are stacked in sequence. Furthermore, a hole injection layer (not shown in FIG. 2) may also be arranged between the hole transport layer 20 and the anode 10, and/or an electron injection layer (not shown in FIG. 2) may also be arranged between the electron transport layer 40 and the cathode 50.

In case that the electron transport layer 40 is prepared according to the above preparation method of the charge transport layer, the formed cathode 50 serves as the matrix 1, the electron-transport material ink serves as the second solution, and the electron transport layer 40 is prepared on the outer surface of the cathode 50 according to the above preparation method of the charge transport layer. In case that an electron injection layer is included in the inversion light-emitting diode, as shown in FIG. 2, the formed electron injection layer serves as the matrix 1, the electron-transport material ink serves as the second solution, and the electron transport layer 40 is prepared on the outer surface of the electron injection layer according to the above preparation method of the charge transport layer. Subsequently, the light emitting layer 30, the hole transport layer 20, (or the hole injection layer further formed) and the anode 10 are successively formed on the outer surface of the hole transport layer 20 according to the existing methods.

In case that the hole transport layer 20 is prepared according to the above preparation method of the charge transport layer, the formed light-emitting layer 30 serves as the matrix 1, the hole-transport material ink serves as the second solution, the hole transport layer 20 is prepared on the outer surface of the light-emitting layer 30 according to the above preparation method of the charge transport layer.

In order to enable the above implementation details and operations of the present application to be clearly understood by those skilled in the art, and to remarkably reflect the improved performance of the preparation method of the charge transport layer, the light-emitting diode and the method for preparing the light-emitting diode in the embodiments of the present application, the following multiply examples are provided to exemplarily illustrate the above solutions.

In the following examples, QLED is used as an example for description. The QLED has a structure of ITO/hole transport layer (30 nm)/CdSe/ZnS (40 nm)/electron transport layer (40 nm)/Ag (120 nm). It should be understood that the structure of the QLED here is only an exemplary structure, and the present application will not be limited in here.

Example 1

In this example, a quantum-dot light-emitting diode (QLED) and a preparation method of the QLED are provided.

The QLED is the positive quantum-dot light-emitting diode shown in FIG. 2, which has a structure of ITO/ PEDOT:PSS (30 nm) hole transport layer (30 nm)/CdSe/ ZnS (40 nm)/electron transport layer (40 nm)/Ag (120 nm). The slash "I" indicates the connection relation of layer structure combined by layers.

The preparation method of the QLED in this example includes steps S1-S4.

In step S1, a substrate is provided, and a bottom electrode (anode) is formed on the substrate.

In step S2: an organic hole injection layer, an organic hole transport layer, and a quantum-dot light-emitting layer are sequentially deposited on the bottom electrode.

In step S3: a zinc oxide-ethanol solution is firstly deposited on a surface of the quantum-dot light-emitting layer to form a zinc oxide electron-transport wet film layer, i.e., the second film layer; a triethylamine-acetone solution is then deposited on a surface of the zinc oxide electron-transport wet film layer to form a first film layer containing triethylamine, thereby forming a composite wet film layer of zinc oxide-triethylamine, and then the composite wet film layer of zinc oxide-triethylamine is subjected to a heat treatment in an inert atmosphere on a heating table at 120° C. for 50 mins to form a zinc oxide electron transport layer. In the composite wet film layer of zinc oxide-triethylamine, a molar ratio of triethylamine to zinc oxide is 2:1.

In step S4, a top electrode is deposited on the zinc oxide electron transport layer.

Example 2

In this example, a QLED and a preparation method of the QLED are provided.

The QLED is the positive quantum-dot light-emitting diode shown in FIG. 2, the structure of the QLED in this example is the same as that in Example 1.

The preparation method of the QLED in this example includes steps S1-S4.

In step S1, a substrate is provided, and a bottom electrode (anode) is formed on the substrate.

In step S2, an organic hole injection layer, an organic hole transport layer, and a quantum-dot light-emitting layer are sequentially deposited on the bottom electrode.

In step S3, a zinc oxide-ethanol solution is firstly deposited on a surface of the quantum-dot light-emitting layer to form a zinc oxide electron-transport wet film layer, i.e., the second film layer; a triethylamine-acetone solution is then deposited on a surface of the zinc oxide electron-transport wet film layer to form a first film layer containing triethylamine, thereby forming a composite wet film layer of zinc oxide-triethylamine, and then the composite wet film layer of zinc oxide-triethylamine is subjected to a heat treatment in an inert atmosphere on a heating table at 120° C. for 30 mins to form a zinc oxide electron transport layer. In the composite wet film layer of zinc oxide-triethylamine, a molar ratio of triethylamine to zinc oxide is 2:1.

In step S4, a top electrode is deposited on the zinc oxide electron transport layer.

Example 3

In this example, a QLED and a preparation method of the QLED are provided.

The QLED is the positive quantum-dot light-emitting diode shown in FIG. 2, which has a structure of ITO/NiO hole transport layer (30 nm)/CdSe/ZnS (40 nm)/zinc oxide electron transport layer (40 nm)/Ag (120 nm). The slash "I" indicates the connection relation of layer structure combined by layers.

The preparation method of the QLED in this example includes steps S1-S5.

In step S1, a substrate is provided, and a bottom electrode (anode) is formed on the substrate.

In step S2, a NiO-water solution is spin-coated on the bottom electrode to form a NiO hole-transport wet film layer; a triethylamine-n-butanol solution is then deposited on a surface of the NiO hole-transport wet film layer to form a triethylamine functional wet film layer, thereby forming a composite wet film layer of NiO-triethylamine, and then the composite wet film layer of NiO-triethylamine is subjected to a heat treatment on a heating table at 120° C. for 30 mins to form a NiO hole transport layer.

In step S3, a quantum-dot light-emitting layer is formed on a surface of the NiO hole transport layer.

In step S4, a zinc oxide-ethanol solution is firstly deposited on a surface of the quantum-dot light-emitting layer to form a zinc oxide electron-transport wet film layer, and then the zinc oxide electron-transport wet film layer is directly subjected to a heat treatment in an inert atmosphere on a heating table at 100° C. for 50 mins to form a zinc oxide electron transport layer.

In step S5, a top electrode is deposited on the zinc oxide electron transport layer.

Comparative Example 1

In this comparative example, a QLED and a preparation method of the QLED are provided. The structure of the QLED in this comparative example is the same as that in Example 1. The zinc oxide electron transport layer included in the QLED in this comparative example is different from that in Example 1, and is prepared according to step S3 of the following preparation method of the QLED.

The preparation method of the QLED in this comparative example includes steps S1-S4.

In step S1, a substrate is provided, and a bottom electrode (anode) is formed on the substrate.

In step S2, an organic hole injection layer, an organic hole transport layer, and a quantum-dot light-emitting layer are sequentially deposited on the bottom electrode.

In step S3, a zinc oxide-ethanol solution is deposited on a surface of the quantum-dot light-emitting layer to form a zinc oxide electron-transport wet film layer; and then the zinc oxide electron-transport wet film layer is directly subjected to a heat treatment on a heating table at 120° C. for 15 mins to form a zinc oxide electron transport layer.

In step S4, a top electrode is deposited on the zinc oxide electron transport layer.

Comparative Example 2

In this comparative example, a QLED and a preparation method of the QLED are provided. The structure of the QLED in this comparative example is the same as that in Example 1. The zinc oxide electron transport layer included in the QLED in this comparative example is different from that in Example 1, and is prepared according to step S3 of the following preparation method of the QLED.

The preparation method of the QLED in this comparative example includes steps S1-S4.

In step S1, a substrate is provided, and a bottom electrode (anode) is formed on the substrate.

In step S2, an organic hole injection layer, an organic hole transport layer, and a quantum-dot light-emitting layer are sequentially deposited on the bottom electrode.

In step S3, a zinc oxide-ethanol solution is firstly deposited on a surface of the quantum-dot light-emitting layer to form a zinc oxide electron-transport wet film layer; a n-butylamine-acetone solution is then deposited on a surface of the electron-transport wet film layer to form a n-butylamine first film layer, thereby forming a composite wet film layer of zinc oxide-n-butylamine, and then the composite wet film layer of zinc oxide-n-butylamine is subjected to a heat treatment in an inert atmosphere on a heating table at 120° C. for 50 mins to form a zinc oxide electron transport layer.

In step S4, a top electrode is deposited on the zinc oxide electron transport layer.

Comparative Example 3

In this comparative example, a QLED and a preparation method of the QLED are provided.

The QLED is the positive quantum-dot light-emitting diode shown in FIG. 2, the structure of the QLED in this example is the same as that in Example 1. The zinc oxide electron transport layer included in the QLED in this comparative example is different from that in Examples 1 and 2, and is prepared according to step S3 of the following preparation method of the QLED.

The preparation method of the QLED in this comparative example includes steps S1-S4.

In step S1, a substrate is provided, and a bottom electrode (anode) is formed on the substrate.

In step S2, an organic hole injection layer, an organic hole transport layer, and a quantum-dot light-emitting layer are sequentially deposited on the bottom electrode.

In step S3, a zinc oxide-ethanol solution is firstly deposited on a surface of the quantum-dot light-emitting layer to form a zinc oxide electron-transport wet film layer; a tripropylphosphine-methyl formate solution is then deposited on a surface of the electron-transport wet film layer to form a tripropyl phosphine phosphine first film layer to form a composite wet film layer of zinc oxide-tripropylphosphine, and then the composite wet film layer of zinc oxide-tripropylphosphine is subjected to a heat treatment on a heating table at 100° C. for 50 mins in an inert atmosphere to form a zinc oxide electron transport layer. In the composite wet film layer of zinc oxide-tripropylphosphine, a mass ratio of tripropyl phosphine to zinc oxide is 2:1.

In step S4, a top electrode is deposited on the zinc oxide electron transport layer.

Comparative Example 4

In this comparative example, a QLED and a preparation method of the QLED are provided. The structure of the QLED in this comparative example is the same as that in Example 1. The zinc oxide electron transport layer included in the QLED in this comparative example is different from that in Example 1, and is prepared according to step S3 of the following preparation method of the QLED.

The preparation method of the QLED in this comparative example includes steps S1-S4.

In step S1, a substrate is provided, and a bottom electrode (anode) is formed on the substrate.

In step S2, an organic hole injection layer, an organic hole transport layer, and a quantum-dot light-emitting layer are sequentially deposited on the bottom electrode.

In step S3, a zinc oxide-ethanol solution is firstly deposited on a surface of the quantum-dot light-emitting layer to form a zinc oxide electron-transport wet film layer; a tripropylamine-acetone solution is then deposit on a surface of the electron-transport wet film layer to form a tripropylamine first film layer, thereby forming a composite wet film layer of zinc oxide-tripropylamine, and then the composite wet film layer of zinc oxide-tripropylamine is subjected to a heat treatment on a heating table at 120° C. for 50 mins in a vacuum environment of –0.1 MPa.

In step S4, a top electrode is deposited on the zinc oxide electron transport layer.

Comparative Example 5

In this comparative example, a QLED and a preparation method of the QLED are provided. The structure of the QLED in this comparative example is the same as that in Example 3. The NiO hole transport layer included in the QLED in this comparative example is different from that in Example 3, and is prepared according to step S2 of the following preparation method of the QLED.

The preparation method of the QLED in this comparative example includes steps S1-S5.

In step S1, a substrate is provided, and a bottom electrode (anode) is formed on the substrate.

In step S2, a NiO-water solution is spin-coated on the bottom electrode to form a NiO hole-transport wet film layer; and then the NiO hole-transport wet film layer is subjected to a heat treatment on a heating table at 120° C. for 30 mins to form a NiO hole transport layer.

In step S3, a quantum-dot light-emitting layer is formed on a surface of the NiO hole transport layer.

In step S4, a zinc oxide-ethanol solution is firstly deposited on a surface of the quantum-dot light-emitting layer to form a zinc oxide electron-transport wet film layer; and then the zinc oxide electron-transport wet film layer is directly subjected to a heat treatment in an inert atmosphere on a heating table at 100° C. for 50 mins to form a zinc oxide electron transport layer.

In step S5, a top electrode is deposited on the zinc oxide electron transport layer.

Photoelectric performance test of quantum-dot light-emitting diodes

External quantum efficiencies (EQE) of the QLED devices prepared in Examples 1 to 4 and Comparative Examples 1 to 4 at a current density of 50 mA cm-2 was tested respectively. The results are shown in Table 1. It can be seen from this table that the EQE of the device after triethylamine treatment is improved, indicating that triethylamine has optimized the thin-film state of the electron transport layer.

15

TABLE 1

|  | Example | | | Comparative Example | | | | |
| --- | --- | --- | --- | --- | --- | --- | --- | --- |
|  | 1 | 2 | 3 | 1 | 2 | 3 | 4 | 5 |
| EQE (%) | 7.3 | 7.5 | 3.2 | 4.1 | 4.2 | 2.1 | 3.9 | 2.1 |

Further, EL topographies of the QLED devices prepared in Example 1, Example 2, and Comparative Example 3 were tested at a current density of 50 mA cm-2, and the results are shown in FIGS. 4A-4C, respectively.

It thus can be seen from the EQE data in Table 1 that, upon a comparison of the EQE of the QLED provided by Example 1 and Example 2 and the EQE of the QLED device provided by Comparative Example 1, the EQE values of Example 1 and Example 2 are significantly higher than the EQE value of Comparative Example 1.

It can be seen that, upon a comparison of the EQE of the QLED provided by Example 3 and the EQE of the QLED device provided by Comparative Example 5, the EQE value of Example 3 is also significantly higher than that in Comparative Example 5.

This indicates that triethylamine serves as a functional material can effectively combine with the metal cation dangling bonds on the surface of the metal oxide nanocrystals, thereby achieving the effect of end capping, so that the metal oxide nanocrystals will first form a stable state similar to "oligomers" during the volatilization process of the ink solvent, and these "oligomers" will undergo an ordered arrangement similar to polymer polymerization during the deposition process of metal oxide nanocrystals, making the deposition process more orderly and reducing opportunities for defects in the film formation process, and triethylamine is also easily removed when the solvent volatilization is complete. Referring to FIG. 4A and FIG. 4B, it can be seen that the triethylamine is used as a functional material to form the electron transport layer, which not only has reduced defects but also presents a uniform thickness, so that the EQE of the QLED in Example 1 and Example 2 is higher than in Comparative Example 1, the EQE of the QLED in Example 3 is higher than that in Comparative Example 5.

It can be seen that, upon a comparison of the EQE of the QLED provided by Example 1 and Example 2 and the EQE of the QLED device provided by Comparative Example 3, the EQE value of Example 1 and Example 2 is significantly higher than that in Comparative Example 3.

Referring also to FIGS. 4A-4C, FIG. 4A, FIG. 4B and FIG. 4C, the reason may be that phosphine compounds is difficult to remove in the subsequent process due to the strong bond energy between phosphine compounds and metal oxide nanocrystals, which affects the film-forming property of the composite wet film layer of zinc oxide-tripropylphosphine, and leads to the unevenness of the formed zinc oxide electron transport layer, forming the EL morphology as shown in FIG. 4C, which also affects the luminous efficiency of the QLED and reduces the EQE value of the QLED.

It can be seen that, upon a comparison of the EQE of the QLED provided by Example 1 and Example 2 and the EQE of the QLED device provided by Comparative Example 2 and Comparative Example 4, the EQE values of Example 1 and Example 2 are also significantly higher than those of Comparative Example 2 and Comparative Example 4. This indicates that n-butylamine and tripropylamine serves as functional materials cannot realize the orderly arrangement of metal oxide nanocrystals in the electron transport layer to reduce the defects of the electron transport layer. The reason may be that the steric hindrance effect of n-butylamine is weak, although n-butylamine has an electron-donating group like triethylamine, it cannot prevent the agglomeration of the capped metal oxide nanocrystals, that is, in the metal oxide nanocrystal material in the electron transport layer in Example 2 is agglomerated, so that the ordered arrangement of the metal oxide nanocrystal material cannot be achieved. Thus, the EQE of the QLED of Comparative Example 2 is close to that of Comparative Example 1. In Comparative Example 4, tripropylamine serves as a functional material did not achieve the expected effect either. It may be caused by the weak binding ability of tripropylamine and metal oxides, which makes it difficult to achieve the stable state of "oligomer", so metal oxide nanocrystals in the electron transport layer cannot be "guided" to be arranged in an orderly manner, Thus, the EQE of the QLED of Comparative Example 3 is also close to that of Comparative Example 1.

The foregoing are only optional embodiments of this application and are not intended to limit the present application. Any modification, equivalent replacement, improvement, etc. made within the spirit and principle of the present application shall be included within the scope of the claims of the present application.

What is claimed is:

1. A preparation method of a charge transport layer, comprising:

forming a first film layer by a first solution containing a functional material, forming a second film layer by a second solution containing a charge transport material, and enabling the first film layer and the second film layer to be in contact with each other; or alternatively, forming a mixed film layer by a mixed solution of the first solution containing the functional material and the second solution containing the charge transport material; and removing the functional material to obtain a charge transport layer;

wherein the functional material is an organic substance containing an electron-donating group, a surface of the charge transport material has a metal cation dangling bond, and the electron-donating group is capable of being bonded with the metal cation dangling bond, wherein in the first film layer and the second film layer that are in contact with each other or in the mixed film layer, a molar ratio of the functional material to the charge transport material is in a range from 1.5:1 to 3:1;

the functional material comprises triethylamine; and the charge transport material is an electron-transport material, and the charge transport material comprises at least one of $ZnO$, $SnO$, $TiO_2$ and $ZrO_2$, or comprises at least one of $ZnO$, $SnO$, $TiO_2$ and $ZrO_2$ doped with at least one of Li, Al, Mg, Cs, In, Ga, and Zr.

2. The preparation method according to claim 1, wherein the enabling the first film layer and the second film layer to be contacted with each other comprises:

forming the second film layer on a matrix by the second solution; and forming the first film layer on a surface of the second film layer by the first solution.

3. The preparation method according to claim 1, wherein the enabling the first film layer and the second film layer to be contacted with each other comprises:

forming the first film layer on a matrix by the first solution; and forming the second film layer on a surface of the first film layer by the second film.

4. The preparation method according to claim 1, the forming a mixed film layer by a mixed solution of the first solution and the second solution comprises:

forming the mixed film layer on a matrix by the mixed solution of the first solution and the second solution.

5. The preparation method according to claim 1, wherein a volume ratio of the functional material to a solvent in the first solution is in a range from 1:1 to 1:50.

6. The preparation method according to claim 1, wherein a solvent of the first solution comprises at least one of acetone, n-butanol, tetrahydrofuran, and methyl formate.

7. The preparation method according to claim 1, wherein solvents of the first solution and the second solution are mutually soluble or have similar polarities when the first film layer and the second film layer are in contact with each other.

8. The preparation method according to claim 1, wherein the removing the functional material comprises:

performing a heat treatment on the first film layer and the second film layer being in contact with each other or performing the heat treatment on the mixed film layer in an inert gas atmosphere, so that the functional material is volatilized or removed.

9. The preparation method according to claim 8, wherein the heat treatment is performed at a temperature in a range from 90° C. to 150° C.

10. The preparation method according to claim 9, wherein time for the heat treatment is in a range from 5 min to 24 h.

11. The preparation method according to claim 1, wherein the charge transport material further comprises an electron-transport layer.

12. The preparation method according to claim 11, wherein the hole-transport material comprises at least one of MoO$_3$, NiO, V$_2$O$_5$, and WO$_3$, or comprises at least one of MoO$_3$, NiO, V$_2$O$_5$ and WO$_3$ doped with at least one of Li, Al, Mg, Cs, In, Ga, and Zr.

13. A light-emitting diode, comprising:

an electron transport layer or a hole transport layer, wherein the electron transport layer is prepared according to the preparation method of claim 1, and the charge transport material is an electron-transport material when the electron transport layer is included in the light-emitting diode, and wherein the hole transport layer is prepared according to the preparation method of claim 1, and the charge transport material is a hole-transport material when the hole transport layer is included in the light-emitting diode.

14. A light-emitting diode, comprising:

an electron transport layer; and a hole transport layer, wherein the electron transport layer is prepared according to the preparation method of claim 1, the hole transport layer is prepared according to the preparation method of claim 1, and the charge transport material comprises an electron-transport material and a hole-transport material.

15. The light-emitting diode according to claim 13, wherein the light-emitting diode is a quantum-dot light-emitting diode (QLED) or an organic light-emitting diode (OLED).

16. The light-emitting diode according to claim 14, wherein the light-emitting diode is a quantum-dot light-emitting diode (QLED) or an organic light-emitting diode (OLED).

* * * * *